United States Patent
Sezi et al.

[11] Patent Number: 6,120,970
[45] Date of Patent: Sep. 19, 2000

[54] POLYBENZOXAZOLE AND POLYBENZOTHIAZOLE PRECURSORS

[75] Inventors: Recai Sezi, Röttenbach; Michael Keitmann, Weisendorf, both of Germany

[73] Assignee: Siemens Aktiengesellschaft, Munich, Germany

[21] Appl. No.: 09/161,202

[22] Filed: Sep. 25, 1998

[30] Foreign Application Priority Data

Sep. 24, 1997 [DE] Germany ............ 197 42 191

[51] Int. Cl.[7] ............ G03C 1/52; C08G 69/00
[52] U.S. Cl. ............ 430/192; 430/146; 430/149; 528/327; 528/360; 528/367; 528/373
[58] Field of Search .................... 430/192, 146, 430/149; 528/327, 360, 367, 373

[56] References Cited

U.S. PATENT DOCUMENTS

| | | | |
|---|---|---|---|
| 4,339,521 | 7/1982 | Ahne et al. | 430/192 |
| 4,849,051 | 7/1989 | Ahne et al. | 156/659.1 |
| 4,965,134 | 10/1990 | Ahne et al. | 428/411.1 |
| 5,077,378 | 12/1991 | Mueller et al. | 528/185 |
| 5,194,562 | 3/1993 | Inbasekaran et al. | 528/125 |
| 5,376,499 | 12/1994 | Hammerschmidt et al. | 430/192 |
| 5,449,584 | 9/1995 | Banba et al. | 430/190 |

FOREIGN PATENT DOCUMENTS

| | | |
|---|---|---|
| 0023662 | 5/1983 | European Pat. Off. |
| 0264678 | 9/1991 | European Pat. Off. |
| 0291778 | 3/1994 | European Pat. Off. |
| 0291779 | 7/1994 | European Pat. Off. |
| 0 733 665 A1 | 9/1996 | European Pat. Off. |
| 2 595 362-A1 | 9/1987 | France. |
| 1 811 588 A C3 | 1/1973 | Germany. |
| 26 47 004 A1 | 4/1978 | Germany. |
| 3716629 | 6/1997 | Germany. |
| 2 188 936 B | 12/1988 | United Kingdom. |

OTHER PUBLICATIONS

"Two–Step Synthesis of Alkyl–and Alkenylbenzoxazole Polymers", mathias et al., Macromolecules 1985, 18, pp. 616–622.

"Polymers in Microelectronics—Fundamentals and Applications", Soane et al., Elsevier Science Publishers B.V., Amsterdam, 1989, pp. 189–191.

N.M. Ignatenko et al.: "Bis(3–amino–4–hydroxphenoxy)perfluoroarylenes as monomers fro producing polybenzoxazoles with hihger thermal and hydrolytic stability", Chemical Abstracts XP–002088350.

*Primary Examiner*—Janet Baxter
*Assistant Examiner*—Barbara Gilmore
*Attorney, Agent, or Firm*—Herbert L. Lerner; Laurence A. Greenberg

[57] ABSTRACT

The polybenzoxazole and polybenzothiazole precursors of the invention have the following partial structure:

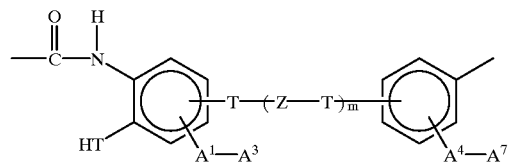

where:

$A^1$ to $A^7$ are—independently of one another—H, F, $CH_3$, $CF_3$, $OCH_3$, $OCF_3$, $CH_2CH_3$, $CF_2CF_3$, $OCH_2CH_3$ or $OCF_2CF_3$;

T is O or S, and m is 1;

Z is a carbocyclic or heterocyclic aromatic radical.

15 Claims, No Drawings

POLYBENZOXAZOLE AND POLYBENZOTHIAZOLE PRECURSORS

BACKGROUND OF THE INVENTION

Field of the Invention

The invention relates to novel polybenzoxazole and polybenzothiazole precursors and to resist solutions containing these precursors.

Throughout the specification and claims, the parenthetical expression (thio) is used as a convenient abbreviation to denote independently at each occurrence the alternative presence of oxygen or sulfur in hydroxyl, mercaptan, ether and thioether groups, as in poly[phenolcarboxamide phenyl ether] and poly[thiophenolcarboxamide phenyl thioether] precursors for polybenzoxazoles and polybenzothiazoles respectively.

In microelectronics, highly heat-resistant polymers are needed as protection and insulation layers. Such polymers can be employed as dielectric between two metal planes, for example in multi chip modules and memory and logic chips, or as buffer coat between the chip and its housing. Some of these polymers, for example precursors of aromatic polyimides (PIs) and polybenzoxazoles (PBOs), have good solubility in organic solvents and good film-forming properties and can be applied to the electronic components by inexpensive spin-coating methods.

The precursors are then cyclized, i.e. converted into the corresponding polymer, by heat treatment, and thus obtain their final properties.

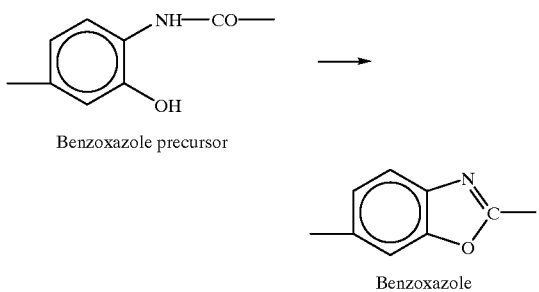

Benzoxazole precursor

Benzoxazole

The cyclization is accompanied by disappearance of the polar, hydrophilic groups of the PBO precursor (OH, NH and CO), which would otherwise adversely affect the dielectric properties and water absorption. This is, for example, an essential advantage of polybenzoxazoles over polyimides and in particular over hydroxy-polyimides. However, the cyclization is not important just for good dielectric properties and low water absorption of the end product, but also for its high heat stability.

The demands made of the cyclized final product are very high. For example, besides the lowest possible dielectric constant and high thermal stability, a particular requirement is for low moisture absorption. This is because absorbed moisture impairs not only the electrical properties, but can also promote corrosion of the metallic conductor tracks or result in bubble formation and flaking at high temperatures. Polyimides and polybenzoxazoles have the following advantages over many other high-temperature-stable polymers:

In contrast to the cyclized end product, they can be applied to a substrate as a soluble precursor and then cyclized, during which the solubility and thus the sensitivity to solvents and other process chemicals decreases greatly. For this reason, the processing of, for example, precyclized polybenzoxazoles is difficult.

The addition of suitable photoactive components to the precursors allows the preparation of photo-sensitive compositions, enabling inexpensive, direct structuring of the dielectric. Polybenzoxazoles have the further advantage over polyimides of being structurable in positive mode and developable in aqueous-alkaline media (see EP 0 023 662 B1, EP 0 264 678 B1 and EP 0 291 779 B1). To this end, the PBO precursors used must be soluble in alkaline developers, preferably ones which are free from metal ions.

Benzocyclobutene (BCB), which can be processed in a similar way and structured negatively, has a significantly lower heat stability than polyimide and polybenzoxazole.

A further, important requirement in connection with inexpensive production of microelectronic components is the planarization capacity of the dielectric. The reason for this is that, during the production of such components, level differences occur during application of various layers, making further processing, for example lithographic production of fine structures, more difficult. By contrast, a planarized substrate allows photo-lithographic processes to be carried out with better dimensional accuracy and greater process tolerances. The use of a dielectric which allows good planarization enables expensive polishing procedures (chemical mechanical polishing, CMP) to be avoided in the production of the components.

Alkali-soluble PBO precursors which are suitable for the preparation of photosensitive compositions are disclosed, for example, in EP 0 023 662 B1, EP 0 264 678 B1, EP 0 291 779 B1 and DE 37 16 629 C2; these precursors can be cyclized on the substrate (in this respect, see EP 0 291 778 B1). However, the known polymers exhibit relatively high moisture absorption, for example 1.7% (see EP 0 291 778 B1), after cyclization (conversion into the polybenzoxazole). There is no mention of the planarization capacity of the polymers prepared.

SUMMARY OF THE INVENTION

According to this invention, there are provided poly[(thio)phenolcarboxamide phenyl(thio)ether] polybenzoxazole and polybenzothiazole precursors which are readily soluble in both organic solvents and in aqueous-alkaline developers which are free from metal ions, are highly suitable for photosensitive compositions and can be processed by spin-coating methods. These precursors are easy to cyclize on substrates and, after cyclization, have, in particular, very low moisture absorption of 1% by weight or even less, and a high degree of planarization, in addition to high heat stability.

The poly[(thio)phenolcarboxamide phenyl (thio)ether] polybenzoxazole and polybenzothiazole precursors of this invention contain the following partial structure:

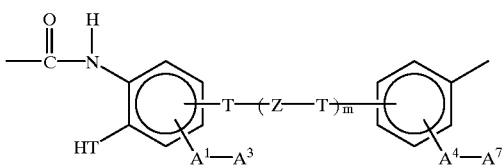

where:
$A^1$ to $A^7$ are—independently of one another—H, F, $CH_3$, $CF_3$, $OCH_3$, $OCF_3$, $CH_2CH_3$, $CF_2CF_3$, $OCH_2CH_3$ or $OCF_2CF_3$;
and where independently at each occurrence T is O or S, m is 0 or 1, and Z is one of the following carbocyclic or heterocyclic aromatic radicals:

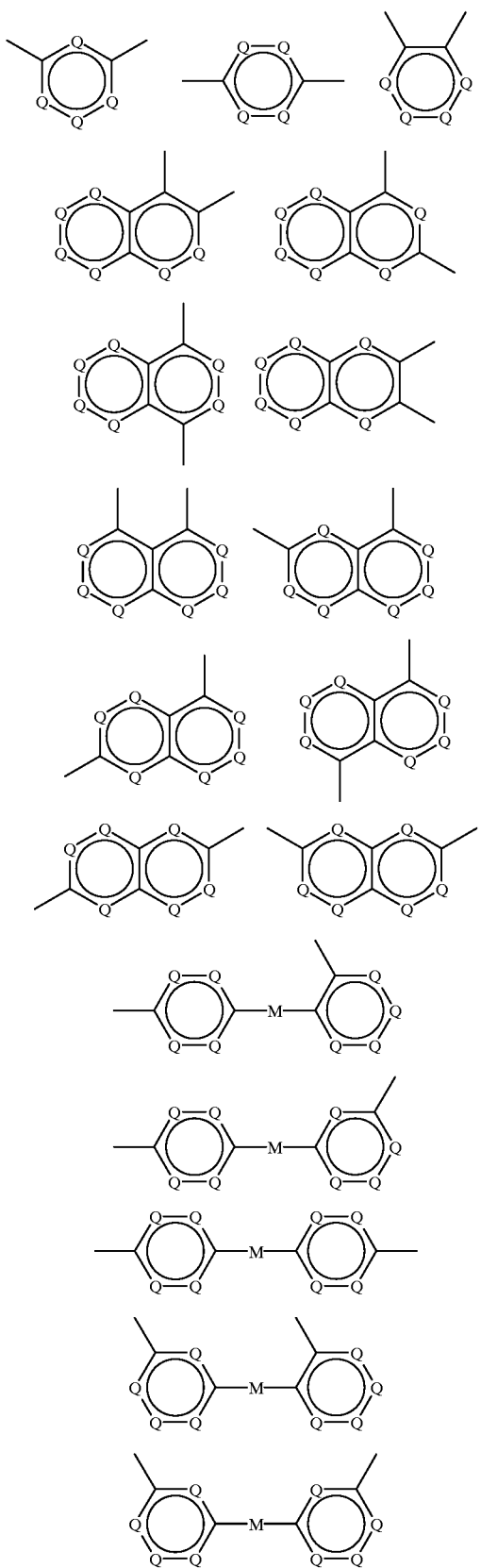

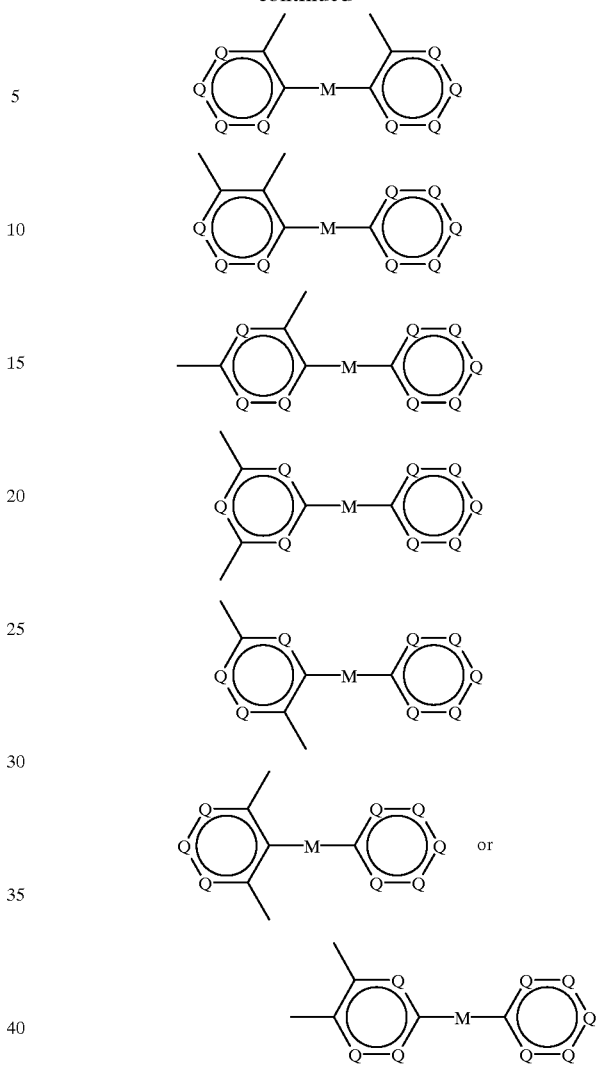

where Q=C—A or N, where A=H, F, $(CH_2)_p CH_3$, $(CF_2)_p CF_3$, $O(CH_2)_p CH_3$, $O(CF_2)_p CF_3$, $CO(CH_2)_p CH_3$, $CO(CF_2)_p CF_3$ where p=0 to 8 (linear or branched chain), $OC(CH_3)_3$, $OC(CF_3)_3$, $C_6H_5$, $C_6F_5$, $OC_6H_5$, $OC_6F_5$, cyclopentyl, perfluorocyclopentyl, cyclohexyl or perfluorocyclohexyl, where, in the isolated aromatic rings, a maximum of 3 N-atoms may be present per ring and only 2 N-atoms may be adjacent, and, in the fused ring systems, a maximum of 2 N-atoms may be present per ring, M=a single bond, $(CH_2)_n$, $(CF_2)_n$, $CH(CH_3)$, $CH(CF_3)$, $CF(CH_3)$, $CF(CF_3)$, $C(CH_3)_2$, $C(CF_3)_2$, $CH(C_6H_5)$, $CH(C_6F_5)$, $CF(C_6H_5)$, $CF(C_6F_5)$, $C(CH_3)(C_6H_5)$, $C(CH_3)(C_6F_5)$, $C(CF_3)(C_6H_5)$, $C(CF_3)(C_6F_5)$, $C(C_6H_5)_2$, $C(C_6F_5)_2$, CO, $SO_2$,

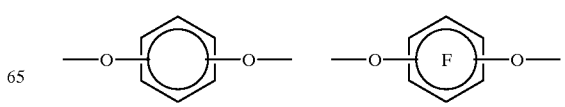

-continued

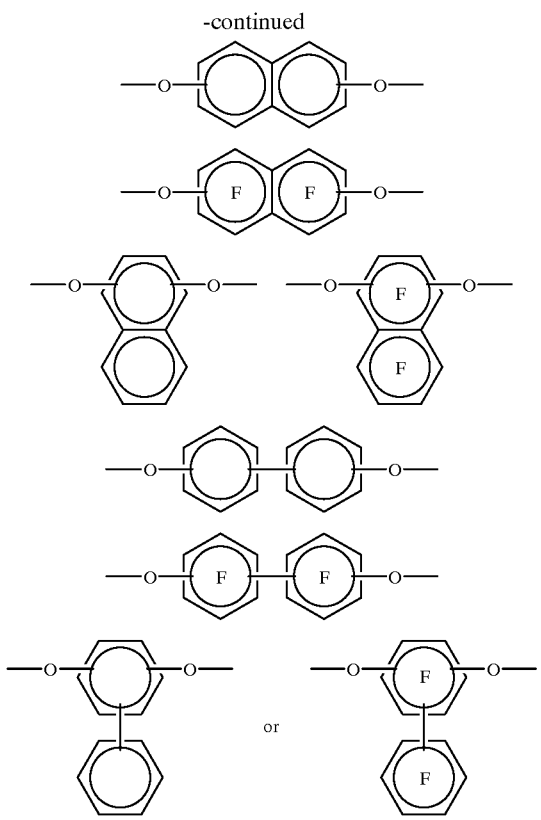

or with the proviso that, when Z=phenylene (these are the first three of the radicals where Q=C—A which are listed above under Z) or m=0, at least one of the radicals $A^1$ to $A^7$ must be other than H.

The poly[(thio)phenolcarboxamide phenyl (thio)ether] polybenzoxazole or polybenzothiazole precursors of this invention have weight average molecular weights of 1000 to 1,000,000, preferably 5000 to 100000.

Polymer precursors of the structure indicated above are prepared by polymerization of one or more corresponding o-aminophenolcarboxylic acids or o-aminothiophenolcarboxylic acids in an organic solvent at a temperature of from 25 to 130° C. in presence of a suitable polymerization reagent. The reagent can be for example triphenyl phosphite used in an equimolar amount. A base such as pyridine and lithium- or calcium chloride can be added to reaction solution (see "Macromolecules" Vol. 18 (1985), pages 616–622). The polymerization can also be carried out in presence of triphenyl phosphine (see DE 37 16 629 C2) or oxalyl chloride. The resulting polymer is then precipitated by adding the reaction solution drop wise to a suitable precipitant. The precipitated polymer is already ready for use after filtration and drying. Before the precipitation of the polymer, free amino end groups can be masked, i.e. blocked, using a dicarboxylic anhydride.

The poly[(thio)phenolcarboxamide phenyl (thio)ether] polymer precursors of the invention are readily soluble in many organic solvents, such as acetone, cyclohexanone, diethylene glycol monoethyl or diethyl ether, N-methylpyrrblidone, γ-butyrolactone, ethyl lactate, tetrahydrofuran and ethyl acetate, and in aqueous-alkaline developers which are free from metal ions, and can easily be processed by spin-coating methods. After cyclization on the substrate, the resultant polybenzoxazoles and polybenzothiazoles have very low moisture absorption, a high degree of planarization and high heat stability.

The poly[(thio)phenolcarboxamide phenyl (thio)ether] precursors of the invention are compatible with diazoketones and are therefore advantageously suitable for photoresist solutions containing—dissolved in a solvent—a polybenzoxazole or polybenzothiazole precursor and a diazoketone-based photo-active component. Such photoactive compositions surprisingly exhibit high resolution and very good film quality. In the photo-resist solutions, the weight ratio between polybenzoxazole or polybenzothiazole precursor and diazoquinone is advantageously between 1:20 and 20:1, preferably between 1:10 and 10:1.

DESCRIPTION OF THE PREFERRED EMBODIMENTS

The o-aminophenol carboxylic acids and o-aminothiophenol carboxylic acids employed for the preparation of the polybenzoxazole and polybenzothiazole precursors of the invention have the following structure:

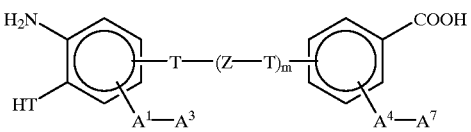

Particularly preferred are such o-aminophenol carboxylic acids and the derived polybenzoxazole precursors, of the above structure in which T=O, m=0, and independently at each occurrence each of $A^1$, $A^2$ and $A^3$ are H or F, each of $A^4$, $A^5$ and $A^6$ are H, and $A^7$ is as defined above; polybenzoxazole precursors in which T=O and m=1, where Z is

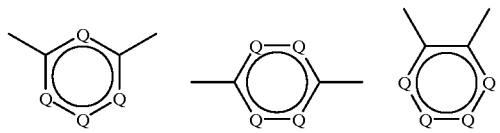

in which from zero to three Q are N not adjacent to one another and the remaining Q are C—H, C—F, or C—$CF_3$, or where Z is

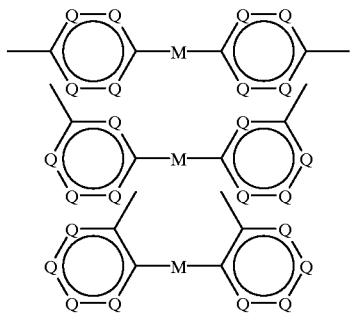

in which Q is C—H or C—F and M is a single bond, $C(CF_3)_2$ or CO.

These precursors are the subject-matter of the following simultaneously filed German patent applications:
DE 197 42 194.6—"o-Amino(thio)phenolcarboxylic acids, and their preparation" (GR 97 P 3689);
DE 197 42 193.8—"o-Amino(thio)phenolcarboxylic acids, and their preparation" (GR 97 P 3692).

Furthermore, the characterizations "$A^1$–$A^3$" and "$A^4$–$A^7$" in the structural formulae mean that the aminophenyl groups contain radicals $A^1$, $A^2$ and $A^3$, and the carboxyphenyl groups contain radicals $A^4$, $A^5$, $A^6$ and $A^7$ respectively.

Examples of such o-aminophenolcarboxylic acids are the following:

4-(4-amino-3-hydroxyphenoxy)-4'-(4-carboxyphenoxy) octafluorobiphenyl
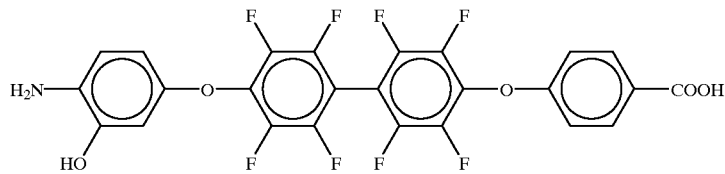
4-(4-amino-3-hydroxyphenoxy)-2-(4-carboxyphenoxy)-3, 5, 6-trifluoropyridine
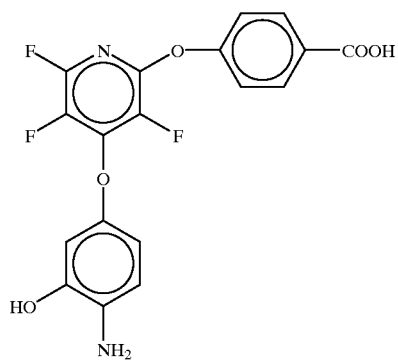
4-(4-amino-3-hydroxyphenoxy)-2-(4-carboxyphenoxy)-1-trifluoromethyl-3, 5, 6-trifluorobenzene
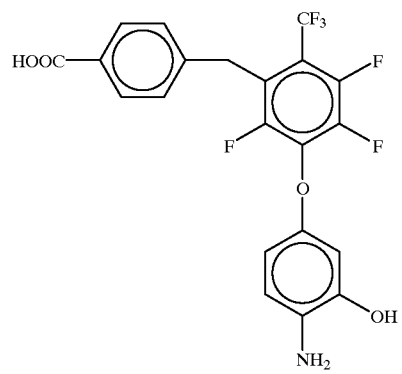
4-(4-amino-3-hydroxy-2, 5, 6-trifluorophenoxy) benzoic acid
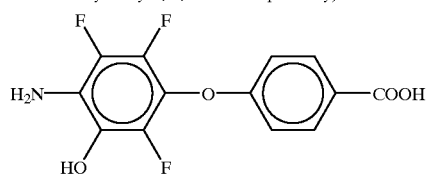
4-(4-amino-3-hydroxy-2, 5, 6-trifluorophenoxy)-4'-(4-carboxyphenoxy)-octafluorobiphenyl
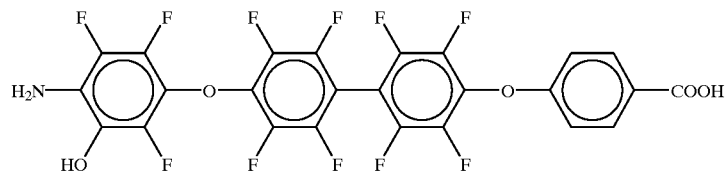

-continued 4-(4-amino-3-hydroxy-2, 5, 6-trifluorophenoxy)-2-(4-carboxyphenoxy)-3, 5, 6-trifluoropyridine

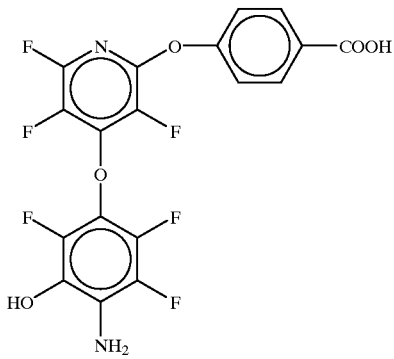

Particularly suitable solvents for the polymer synthesis are dimethylacetamide, γ-butyrolactone and N-methylpyrrolidone. In principle, however, any solvent in which the starting components are readily soluble can be used. Particularly suitable precipitants are water and mixtures of water with various alcohols, for example ethanol and isopropanol.

Cyclization of the o-amino(thio)phenol (thio) ethercarboxylic acid polyamide polybenzoxazole and polybenzothiazole precursors of this invention to moisture- and high temperature stable polybenzoxazoles and polybenothiazoles is effected by heat tempering the precursors at 300–400° C. for 10 minutes to 24 hours, preferably at 325–375° C. for 0.5 to 4 hours.

Photo-resist solutions according to this invention are obtained by combining a solution of a o-amino(thio)phenol (thio)ethercarboxylic acid polyamide polybenzoxazole or polybenzothiazole precursor of this invention in an organic solvent with a photoactive diazoketone component and optionally an adhesion promoter. Effective diazoquinones (o-benzoquinone and o-naphthoquinone diazides) are known and described, for example in U.S. Pat. Nos. 2,767,092, 2,772,972, 2,797,213, 3,046,118, 3,106,465, 3,148,983, 3,669,658 and 4,395,482. Particularly preferred diazoquinones with these properties include for example N-dehydroabietyl-6-diazo-5(6)-oxo-1-naphthalenesulfonamide, 2,2-bis(4-hydroxyphenylpropane) diester of naphthoquinone [1.2]diazo-(2)-5-sulfonic acid, n-dehydroabietyl-3-diazo-4(3)-oxo-1-naphthalenesulfonamide, N-dehydroabietyl-[5.6.7.8]-tetrahydro-4-diazo-(3(4)-oxo-2-napthalenesulfonamide, and N-dextropimaryl-3-diazo-4-oxo[1.5]-cyclohexadiene-1-sulfonamide.

Effective diazoquinones that can be used also include the 1,2-diazonaphthoquinone-4-sulfonic acid and 1,2-diazonapththoquinone-5-sulfonic acid esters of various phenols described in Proc. SPIE 1466 (1991) pages 106–116, which disclosure is here incorporated by reference.

Suitable adhesion promoters include, for example, polyamidocarboxylic acids, such as condensation products of an aromatic tetracarboxylic acid dianhydride with a diaminosiloxane. Such an adhesion promoter condensation product can have the structure

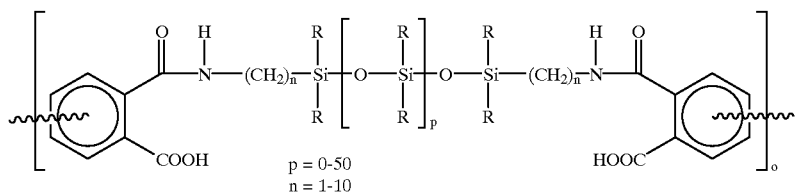

p = 0-50
n = 1-10

Heat stable and moisture-resistant structures are obtained by coating a photo-resist solution according to this invention on a substrate, exposing to actinic light, electron beam or ion beam through a mask and extracting the solubilized portions resulting from the exposure. Preferred substrates include glass, metal, plastic, or semiconductor material, especially silicon wafers.

Further details of known techniques and materials for preparing resist structures are found in U.S. Pat. No. 4,395,482 at column 5 line 15 to column 6 line 57, which disclosure is here incorporated by reference.

The invention will be illustrated in greater detail below with reference to working examples.

EXAMPLE 1

Preparation of an o-aminophenolcarboxylic Acid 4-(4-amino-3-hydroxyphenoxy)-4'-(4-carboxyphenoxy)-octafluorobiphenyl 37.4 g of decafluorobiphenyl (0.112 mol) are dissolved in 700 ml of dimethylformamide, the solution is cooled to −10° C. by means of a cryostat, and a solution of 29.8 g of potassium 4-benzyloxycarbonylphenoxide (0.112 mol) in 300 ml of dimethylformamide is then added drop wise over the course of 2 hours. After 48 hours at −10° C., the potassium salt has reacted. The dimethylformamide is then removed in a rotary evaporator, and the residue is taken up in a little tetrahydrofuran and filtered via a silica-gel column. The clear solution obtained is evaporated in a rotary evaporator until a white solid precipitates. The solid is then stirred in n-hexane, filtered off via a fluted filter and then dried for 48 hours under nitrogen at 40° C./10 mbar in a vacuum drying cabinet.

49.9 g of 4-(4-benzyloxycarbonylphenoxy)nonafluorobiphenyl prepared in this way (0.092 mol) and 26.1 g of potassium 4-nitro-3-benzyloxyphenoxide (0.092 mol ) are dissolved in 400 ml of dimethylformamide, and the solution is heated to 80° C.; the reaction is complete after 24 hours.

The solvent is then removed in a rotary evaporator. The solid residue obtained is washed three times with methanol, filtered off via a Büchner funnel and then dried for 48 hours under nitrogen at 40° C./10 mbar in a vacuum drying cabinet.

49.9 g of 4-(4-nitro-3-benzyloxyphenoxy)-4'-(4-benzyloxycarbonylphenoxy)octafluorobiphenyl prepared in this way (0.065 mol) are dissolved in 400 ml of a mixture of tetrahydrofuran and ethyl acetate (volume ratio 1:1), and 5 g of Pd/C (palladium/carbon) are added to the solution. The mixture is then hydrogenated at room temperature in an autoclave with vigorous stirring using hydrogen at a pressure of 1 bar; after 3 days, the reaction is terminated. The yellow-beige solution is evaporated to half in a rotary evaporator and left to stand overnight at room temperature, during which the reaction product precipitates in crystalline form. The reaction product is then collected and dried for 48 hours under nitrogen at 40° C./10 mbar in a vacuum drying cabinet.

EXAMPLE 2

Preparation of a PBO Precursor 55.7 g of 4-(4-amino-3-hydroxyphenoxy)-4'-(4-carboxyphenoxy)octafluorobiphenyl prepared as described in Example 1 (0.1 mol) are dissolved in 370 ml of distilled N-methylpyrrolidone. A solution of 13 g of oxalyl chloride (0.102 mol) in 85 ml of γ-butyrolactone is slowly added drop wise to this solution at 0° C. After the addition, the mixture is stirred at 0° C. for a further 2 hours and at room temperature for 18 hours. A solution of 20 ml of pyridine in 100 ml of N-methyl-pyrrolidone is then added—in order to complete the reaction—at 0° C., and the mixture is stirred at room temperature for a further 24 hours. The yellow-brown solution is then filtered via a Büchner funnel and added drop wise with vigorous stirring to a mixture of isopropanol and water (1:3). The amount of precipitant (isopropanol/water) is selected so that it corresponds to 10 times the reaction solution. The precipitated polymer is filtered off via a Büchner funnel and washed three times with 1% ammonia solution. After purification, the polymer is dried for 72 hours under nitrogen at 40° C./10 mbar in a vacuum drying cabinet.

The PBO precursor prepared in this way is readily soluble in solvents such as N-methylpyrrolidone, γ-butyrolactone, acetone, tetrahydrofuran, cyclopentanone, diethylene glycol monoethyl ether, ethyl lactate and ethanol, and in commercially available aqueous-alkaline developers which are free from metal ions, such as NMD-W (Tokyo Ohka).

EXAMPLE 3

Determination of Moisture Absorption 4 g of the PBO precursor from Example 2 are dissolved in 12 g of distilled N-methylpyrrolidone. The solution is applied to a substrate in the form of a cleaned, dried and precisely weighed silicon wafer by means of a plastic syringe provided with a prefilter, and spun in a spin-coating apparatus (Convac ST 146). The film formed on the substrate is first predried at 120° C. on a hotplate and then—for the cyclization on the substrate—heated to 350° C. under nitrogen in a programmable laboratory oven ("Sirius junior", LP-Thermtech AG) and held at this temperature for 1 hour, then cooled. The heating and cooling rates are each 5° C./min.

The coated substrate is placed in a tared microbalance (Mettler Toledo AT 261 Deltarange) with a sealed chamber containing phosphorus pentoxide as desiccant. The total weight determined after 24 hours is 11.24863 g. This gives a weight of 0.16321 g for the cyclized polymer (weight of the pure silicon wafer=11.08542 g). The phosphorus pentoxide is then replaced by a saturated sodium chloride solution, and a relative humidity (23° C.) of 76% is established in the chamber. After storage for a further 24 hours, the weight of the film increases to 0.16424 g. This gives a moisture absorption of 0.63%. An uncoated silicon wafer exhibits no moisture absorption under identical conditions.

EXAMPLE 4

Determination of the Degree of Planarization

The planarization capacity of polybenzoxazoles prepared from the precursors of the invention by cyclization on a substrate is determined on silicon wafers having aluminum structures 1.2 micron in height (planarization wafers). The degree of planarization is given for the repeating 5 micron structures (=line and space width; alternating). The degree of planarization is determined as described by D. S. Soane and Z. Martynenko: "Polymers in Microelectronics—Fundamentals and Applications", Elsevier Science Publishers B. V., Amsterdam 1989, pages 189 to 191.

The PBO precursor of Example 2 is applied—as in Example 3—to a planarization wafer (substrate) and cyclized. The cyclized film has a thickness of 2.0 micron; the degree of planarization is 75%.

EXAMPLE 5

Heat Stability

Some of the cyclized polymer of Example 3 is removed from the substrate after the moisture measurement and analyzed thermogravimetrically (Polymer Laboratories STA 1500 instrument). This analysis shows that a weight loss of 1% is not achieved until a temperature of 490° C. By comparison, a weight loss of 1% is already achieved at a temperature of from 420 to 430° C. in known polybenzoxazoles (see SU 1 205 518 A)

EXAMPLE 6

Photostructuring 4 g of the PBO precursor of Example 2 together with 1 g of a diester of bisphenol A and diazonaphthoquinone-5-sulfonic acid (photo-active component) are dissolved in 15 g of N-methylpyrrolidone. This photo-resist solution is applied to a substrate in the form of a cleaned and dried silicon wafer by means of a plastic syringe provided with a prefilter, and is spun in a spin-coating apparatus (Convac ST 146). The resist film formed on the substrate is first predried at 120° C. on a hotplate and then exposed through a mask in an exposure apparatus (Karl Süss 121). After development using an aqueous-alkaline developer (NMD-W, Tokyo Ohka, diluted 1:1 with, water) and cyclization on the substrate at 350° C. as described in Example 3, high-temperature-stable resist structures having a resolution of 2 micron at a layer thickness of 2 micron are obtained.

EXAMPLE 7

Preparation of a PBO Precursor and Determination of its Properties

A PBO precursor is prepared analogously to Example 2 using—under otherwise identical conditions—4-(4-amino-3-hydroxyphenoxy)-2-(4-carboxyphenoxy)-3,5,6-trifluoro-pyridine (0.1 mol, i.e. 39.2 g) as o-aminophenol-carboxylic acid. The o-aminophenolcarboxylic acid is prepared—analogously to Example 1—from pentafluoropyridine, potassium 4-be nzyloxycarbonylphenoxide and potassium 4-nitro-3-benzyloxyphenoxide.

The PBO precursor obtained is readily soluble in the solvents listed in Example 2. For this precursor, a moisture absorption of 0.75% (see Example 3) and a degree of planarization of 77% (see Example 4) are determined. After the photo-structuring carried out as described in Example 6 and cyclization on the substrate, high-temperature-stable resist structures having a resolution of 2 micron at a layer thickness of 1.9 micron are obtained.

EXAMPLE 8

Preparation of a PBO Precursor and Determination of its Properties

A PBO precursor is prepared analogously to Example 2 using—under otherwise identical conditions—4-(4-amino-3-hydroxyphenoxy)-2-(4-carboxyphenoxy)-1-trifluoromethyl-3,5,6-trifluorobenzene (0.1 mol, i.e. 45.9 g) as o-aminophenolcarboxylic acid. The o-aminophenolcarboxylic acid is prepared—analogously to Example 1—from octafluorotoluene, potassium 4-benzyloxycarbonylphenoxide and potassium 4-nitro-3-benzyloxyphenoxide.

The PBO precursor obtained is readily soluble in the solvents listed in Example 2. For this precursor, a moisture absorption of 0.71% (see Example 3) and a degree of planarization of 82% (see Example 4) are determined. After the photo-structuring carried out as described in Example 6 and cyclization on the substrate, high-temperature-stable resist structures having a resolution of 2 micron at a layer thickness of 2.1 micron are obtained.

EXAMPLE 9

Preparation of a PBO Precursor and Determination of its Properties

A PBO precursor is prepared analogously to Example 2 using—under otherwise identical conditions—4-(4-amino-3-hydroxy-2,5,6-trifluorophenoxy)benzoic acid (0.1 mol, i.e. 29.9 g) as o-aminophenol-carboxylic acid. The o-aminophenolcarboxylic acid is prepared—via benzyl 4-(4-nitro-3-hydroxy-2,5,6-trifluorophenoxy)benzoate—from pentafluoronitrobenzene and benzyl 4-hydroxy-benzoate (see Example 1).

The PBO precursor obtained is readily soluble in the solvents listed in Example 2. From this precursor, a moisture absorption of 0.71% (see Example 3) and a degree of planarization of 83% (see Example 4) are determined. After the photo-structuring carried out as described in Example 6 and cyclization on the substrate, high-temperature-stable resist structures having a resolution of 2 micron at a layer thickness of 2.2 micron are obtained.

EXAMPLE 10

Preparation of a PBO Precursor and Determination of its Properties

A PBO precursor is prepared analogously to Example 2 using—under otherwise identical conditions—4-(4-amino-3-hydroxy-2,5,6-trifluorophenoxy)-4'-(4-carboxyphenoxy)-octafluorobiphenyl (0.1 mol, i.e. 61.1 g) as o-aminophenolcarboxylic acid. The o-aminophenolcarboxylic acid is prepared via 4-(4-nitro-3-hydroxy-2,5,6-trifluorophenoxy)-4'-(4-benzyloxycarbonylphenoxy)octafluorobiphenyl (in this respect, see Example 1), which is obtained by reacting 4-(4-benzyloxycarbonylphenoxy)-nonafluorobiphenyl, prepared from decafluorobiphenyl and potassium 4-benzyloxycarbonylphenoxide, with 4-nitrotetrafluorophenol.

The PBO precursor obtained is readily soluble in the solvents listed in Example 2. From this precursor, a moisture absorption of 0.61% (see Example 3) and a degree of planarization of 74% (see Example 4) are determined. After the photo-structuring carried out as described in Example 6 and cyclization on the substrate, high-temperature-stable resist structures having a resolution of 2 micron at a layer thickness of 1.8 micron are obtained.

EXAMPLE 11

Preparation of a PBO Precursor and Determination of its Properties

A PBO precursor is prepared analogously to Example 2 using—under otherwise identical conditions—4-(4-amino-3-hydroxy-2,5,6-trifluorophenoxy)-2-(4-carboxyphenoxy)-3,5,6-trifluoropyridine (0.1 mol, i.e. 44.6 g) as o-aminophenolcarboxylic acid. The o-aminophenolcarboxylic acid is prepared via 4-(4-nitro-3-hydroxy-2,5,6-trifluorophenoxy)-2-(4-benzyloxycarbonylphenoxy)-3,5,6-trifluoropyridine (in this respect, see Example 1), which is obtained by reacting 2-(4-benzyloxycarbonyl-phenoxy)-3,4,5,6-tetrafluoropyridine, prepared from pentafluoropyridine and potassium 4-benzyloxycarbonylphenoxide, with 4-nitrotetrafluorophenol.

The PBO precursor obtained is readily soluble in the solvents listed in Example 2. For this precursor, a moisture absorption of 0.73% (see Example 3) and a degree of planarization of 75% (see Example 4) are determined. After the photo-structuring carried out as described in Example 6 and cyclization on the substrate, high-temperature-stable resist structures having a resolution of 2 micron at a layer thickness of 2 micron are obtained.

We claim:

1. A poly[(thio)phenolcarboxamide phenyl (thio)ether] polybenzoxazole or polybenzothiazole precursor which has the following partial structure:

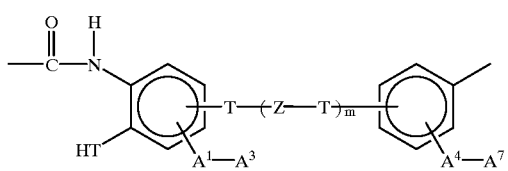

where:

$A^1$ to $A^7$ are—independently of one another—H, F, $CH_3$, $CF_3$, $OCH_3$, $OCF_3$, $CH_2CH_3$, $CF_2CF_3$, $OCH_2CH_3$ or $OCF_2CF_3$;

and where independently at each occurrence T is O or S, m is 1, and

Z is one of the following carbocyclic or heterocyclic aromatic radicals:

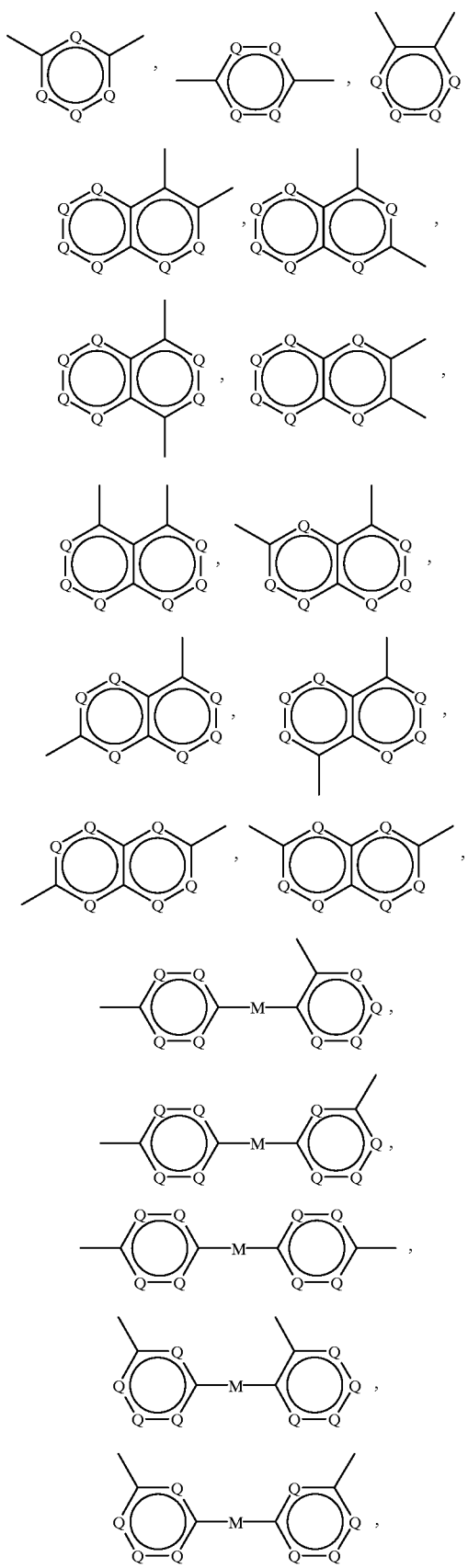

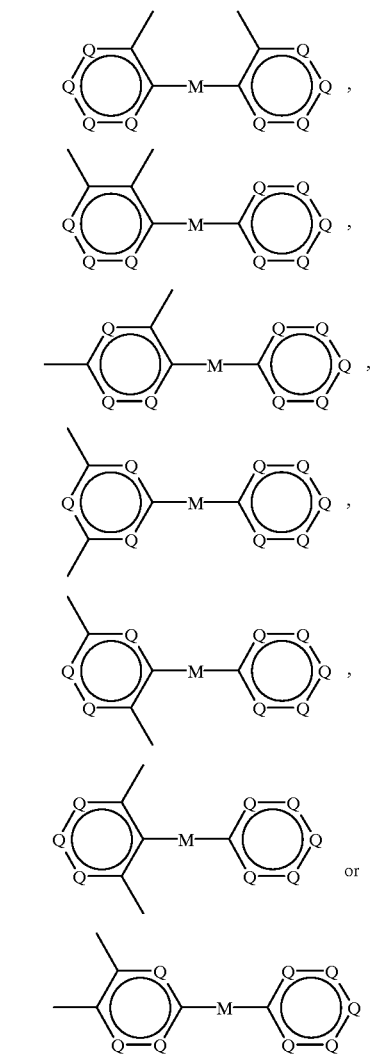

where Q=C—A or N, where A=H, F, $(CH_2)_pCH_3$, $(CF_2)_pCF_3$, $O(CH_2)_pCH_3$, $O(CF_2)_pCF_3$, $CO(CH_2)_pCH_3$, $CO(CF_2)_pCF_3$ where p=0 to 8 (linear or branched chain), $OC(CH_3)_3$, $OC(CF_3)_3$, $C_6H_5$, $C_6F_5$, $OC_6H_5$, $OC_6F_5$, cyclopentyl perfluorocyclopentyl, cyclohexyl or perfluorocyclohexyl, where, in the isolated aromatic rings, a maximum of 3 N-atoms may be present per ring and only 2 N-atoms may be adjacent, and, in the fused ring systems, a maximum of 2 N-atoms may be present per ring, M=a single bond, $(CH_2)_n$, $(CF_2)_n$, $CH(CH_3)$, $CH(CF_3)$, $CF(CH_3)$, $CF(CF_3)$, $C(CH_3)_2$, $C(CF_3)_2$, $CH(C_6H_5)$, $CH(C_6F_5)$, $CF(C_6H_5)$, $CF(C_6F_5)$, $C(CH_3)(C_6H_5)$, $C(CH_3)(C_6F_5)$, $C(CF_3)(C_6H_5)$, $C(CF_3)(C_6F_5)$, $C(C_6H_5)_2$, $C(C_6F_5)_2$, CO, $SO_2$, where n=1 to 8

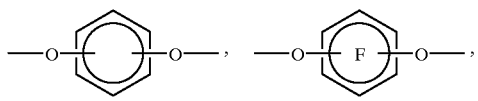

-continued

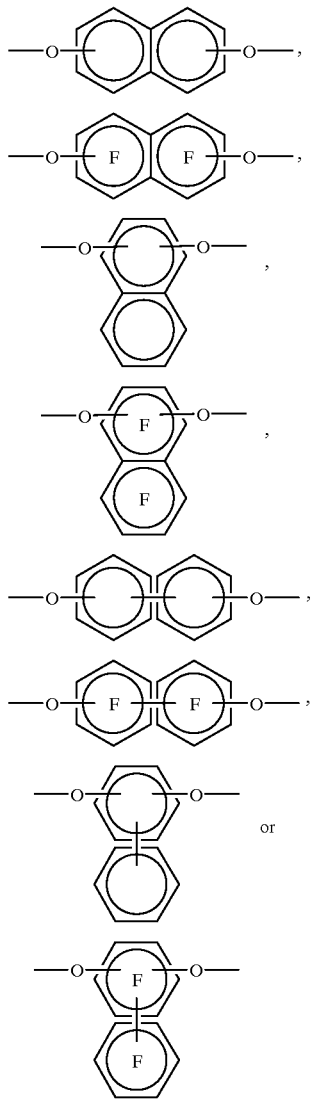

with the proviso that, when Z=phenylene at least one of the radicals $A^1$ to $A^7$ must be other than H.

2. A polybenzoxazole or polybenzothiazole precursor according to claim 1 having a weight average molecular weight in the range from 1,000 to 1,000,000.

3. A polybenzoxazole or polybenzothiazole precursor according to claim 2 having a weight average molecular weight in the range from 5,000 to 100,000.

4. A polybenzoxazole precursor according to claim 1 in which T=O.

5. A polybenzoxazole precursor according to claim 4 in which Z is

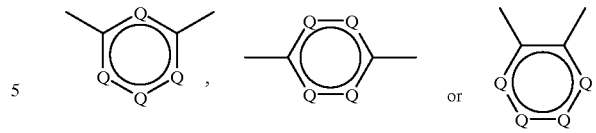

in which from zero to three Q are N not adjacent to one another and the remaining Q are C—H, C—F, or C—CF$_3$.

6. A polybenzoxazole precursor according to claim 4 in which Z is

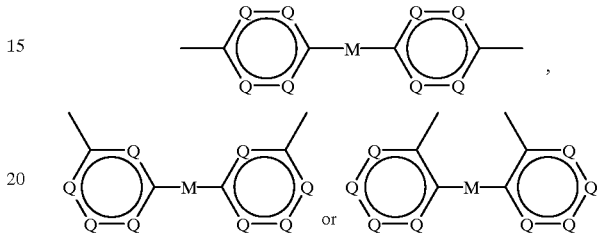

in which Q is C—H or C—F and M is a single bond, $C(CF_3)_2$ or CO.

7. A polybenzoxazole precursor according to claim 5 in which Z is 2,4-(3,5,6-trifluoropyridylene).

8. A polybenzoxazole precursor according to claim 6 in which Z is octafluorobiphenylene.

9. A polybenzoxazole precursor according to claim 6 in which Z is 1,3-(2,4,5-trifluoro-6-trifluoromethyl)phenylene.

10. A photo-resist solution which contains a polybenzoxazole or polybenzothiazole precursor as claimed in claim 1 and a diazoketone as photo-active component, dissolved in an organic solvent.

11. A photo-resist solution as claimed in claim 10, where the diazoketone is a diazoquinone and wherein the weight ratio between the polybenzoxazole or polybenzothiazole precursor and the diazoquinone is between 1:20 and 20:1, preferably between 1:10 and 10:1.

12. A photo resist solution as claimed in claim 10 in which the diazoketone is bisphenol A bis(diazonaphthoquinone-5-sulfonic acid ester).

13. A photo resist solution as claimed in claim 10 in which the solvent is one or more of acetone, γ-butyrolactone, cyclohexanone, diethylene glycol diethyl ether, diethylene glycol monoethyl ether, ethyl acetate, ethyl lactate, N-methylpyrrolidone, and tetrahydrofuran.

14. A moisture resistant and heat resistant resist film comprising a substrate coated with a photo resist solution as claimed in claim 10 and heat tempered.

15. A resist film as claimed in claim 14 in which the substrate is a silicon wafer.

* * * * *